United States Patent [19]

Shelly

[11] 4,455,545

[45] Jun. 19, 1984

[54] HIGH FREQUENCY OUTPUT INDUCTOR FOR INVERTER POWER SUPPLY

[75] Inventor: Randolph D. W. Shelly, Rosemere, Canada

[73] Assignee: Sperry Corporation, New York, N.Y.

[21] Appl. No.: 439,501

[22] Filed: Nov. 5, 1982

[51] Int. Cl.³ .............................................. H01F 5/00
[52] U.S. Cl. .................................... 336/200; 336/178; 336/223; 336/229
[58] Field of Search ............... 336/178, 200, 223, 229; 361/395, 399

[56] References Cited

U.S. PATENT DOCUMENTS

| | | | |
|---|---|---|---|
| 3,210,707 | 10/1965 | Constantakes | 336/200 |
| 3,238,484 | 3/1966 | Daley | 336/178 |
| 3,305,814 | 2/1967 | Moyer | 336/200 |
| 4,007,541 | 2/1977 | Monforte et al. | 336/212 X |
| 4,103,267 | 7/1978 | Olschewski | 336/200 X |
| 4,183,079 | 1/1980 | Wachi | 336/212 X |
| 4,183,783 | 2/1979 | Portier | 162/166 |
| 4,201,965 | 5/1980 | Onyshkevych | 336/200 X |

FOREIGN PATENT DOCUMENTS

| | | | |
|---|---|---|---|
| 63531 | 5/1945 | Denmark | 336/178 |
| 2055236 | 5/1972 | Fed. Rep. of Germany | 336/200 |
| 2603358 | 11/1977 | Fed. Rep. of Germany | 336/200 |
| 55-91804 | 7/1980 | Japan | 336/200 |

*Primary Examiner*—J. V. Truhe
*Assistant Examiner*—Susie Steward
*Attorney, Agent, or Firm*—Howard P. Terry

[57] ABSTRACT

A low self-capacitance inductor is described for use as an output inductor in high frequency inverter power supplies. A pair of channel-shaped ferrite core members are assembled with a gap of material approximating the permeability of air. The core members are arranged to provide an axial aperture therebetween. A plurality of conductor segments are disposed in the aperture and are electrically interconnected to plated through holes in a supporting printed circuit board assembly. The conductor turns for the inductor are selected by the pattern of printed circuit interconnections between selected ones of the plated through holes, whereby the same current densities in the inductor are achieved for different conductor turns arrangements.

7 Claims, 8 Drawing Figures

HIGH FREQUENCY OUTPUT INDUCTOR FOR INVERTER POWER SUPPLY

BACKGROUND OF THE INVENTION

1. Field of the Invention

This invention relates to the field of inductors for use in electrical circuits. More particularly, it relates to an improved inductor structure for use at relatively high frequencies as an output inductor for an inverter power supply.

2. State of the Prior Art

In power supply design, it is often required that power supplies be provided that will give voltages in a range of values. For example, output voltages of 2 volts, 5 volts, and 12 volts are common power supply voltages for use in conjunction with electronic circuitry. One type of power supply in usage involves inverter circuits driving a transformer from a source of input signals, with the secondary of the transformer being utilized to drive a rectifier circuit. The output of the rectifier circuit is commonly applied through output inductors to provide power to circuitry. The inverter circuits are functioning in ranges of 200 kHz and above in the power supply environment. These frequencies and the circuit environment require that the inductors have a low self-capacitance.

The packaging of electronic circuitry and associated power supplies often utilizes printed circuit boards for making circuit interconnection. As the electronic circuitry gets ever-smaller the overall packaging becomes more dense, and it is necessary that associated components become smaller. It is desireable therefore that an inductor for use in the modern day power supplies have a low profile, be compatible with installation in printed circuit board assemblies, be inexpensive, and be adaptable for different power supply requirements.

The prior art has many examples of inductors designed for uses in many applications. At one extreme in size consideration the prior art illustrates a solid-state inductor constructed from multiple thin film layers in U.S. Pat. No. 3,210,707 to Constantakes. This structure is relatively expensive to fabricate and does not have power capabilities or selective turns capability of the subject invention. A relatively large inductor is shown in the D-core structure of U.S. Pat. No. 3,238,484 to Dacey, where windings are wound on the C portion of the core. Others have found improvement to inductors by special composition of the core material, for example shown in U.S. Pat. No. 4,183,079 to Wachi. A specialized structure utilizing segments of ferromagnetic material and associated windings is shown in U.S. Pat. No. 4,183,783 to Portier, and a specialized method of fabrication of ferrite cores for use in a microwave device is shown in U.S. Pat. No. 4,007,541 to Monforte et al.

An inductance fabricated in conjunction with a metal printed circuit board is shown in U.S. Pat. No. 4,201,965 to Onyshkevych. The device taught therein utilizes a metalic supporting board with associated insulating layers, and core material mounted through holes therein. Associated windings are formed in layers of printed circuit foil in spiral configuration around the holes that are utilized to receive the core. None of the discovered prior art illustrates or suggests the structure of the invention.

OBJECTS

A primary object of the invention is to provide an improved inductor for use in the output of inverter power supplies.

Another object of the invention is to provide an improved inductor that will operate in the frequency range of 200 kHz or greater when utilized in a power supply.

Still a further object of the invention is to provide an improved inductor constructed with a core of ferromagnetic material with windings constructed of the combination of conductor segments interconnected by printed circuit conductive paths.

Still another object of the invention is to provide an improved inductor having low self-capacitance.

Another object of the invention is to provide an improved inductor structure having selectable conductor turn such that the selected inductors can be matched to one of several available power supply output.

A further object of the invention is to provide an improved inductor having physical dimensions compatible with other circuit components utilized in constructing power supplies.

SUMMARY OF THE INVENTION

The output inductor for use with high frequency inverter power supplies of this invention includes a mating pair of channel-shaped ferrite core blocks separated by a material having a permeability closely matching that of air. A selected number of conductor segments are aligned axially in the channel opening, with selected ones of the conductor segments electrically interconnected by printed circuit foil paths located on a printed circuit board that supports the inductor assembly. The selection of the number of inductor segments coupled together defines the turns for the inductor configuration, wherein the number of turns determine the current density. The current density is the same for each configuration of the inductor in the selected power supply confgurations.

The foregoing objects of the invention and other more detailed and specific objectives will be shown to have been satisfied in the following description of the embodiments of the invention when considered with the drawings.

DETAILED DESCRIPTION OF THE PREFERRED EMBODIMENT

Figure 1:
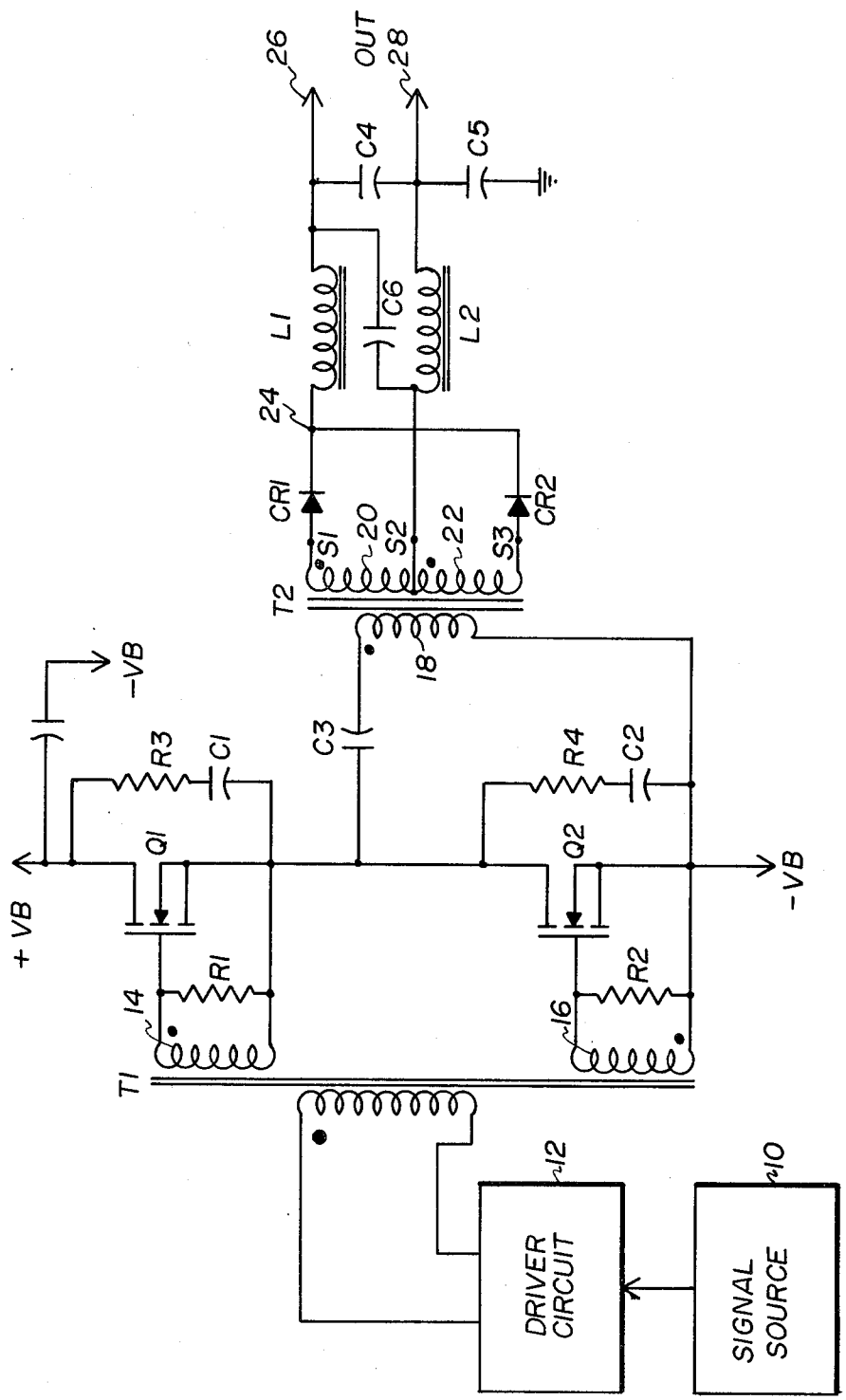
FIG. 1 is a circuit schemtic diagram of a characteristic power supply circuit in which the inductor of this invention can be utilized.

FIG. 1 is a circuit schmatic diagram of a characteristic power supply circuit in which the inductor of this invention can be utilized. Inverter power supplies of this type characteristically utilize a Signal Source 10 to provide a source of drive signals for Driver Circuit 12, which in turn drives the primary winding of Transformer T1. It is desirable to increase the frequency of the Signal Source 10, and the inductor of this invention finds particular advantage at frequencies of 200 kHz and above. The Driver Circuit 12 through Transformer T1 controls a pair of power inverters driven from secondary windings 14 and 16. In this illustrative embodiment, the power inverter drivers are power field effect transistors Q1 and Q2. These inverter drivers drive the primary winding 18 of Transformer T2.

The secondary winding is comprised of windings 20 and 22 and has a tap providing output teminals S1, S2 and S3. Terminal S1 is coupled through diode CR1 to junction 24 and through inductor L1 to output terminal 26. Terminal S3 is coupled through diode CR2 to junction 24. Centertap terminal S2 is coupled through inductor L2 to output terminal 28. Circuit components illustrated are available commercially. Transformer T2 can be of the type described in copending U.S. Pat. application entitled, "High Frequency Inverter Transformer For Power Supplies", Ser. No. 430,534 of Randolph D. W. Shelly, and assigned to the assignee of this invention, though other transformers having appropriate characteristics could be used. Inductors L1 and L2 are the inductors of this invention.

Figure 2:
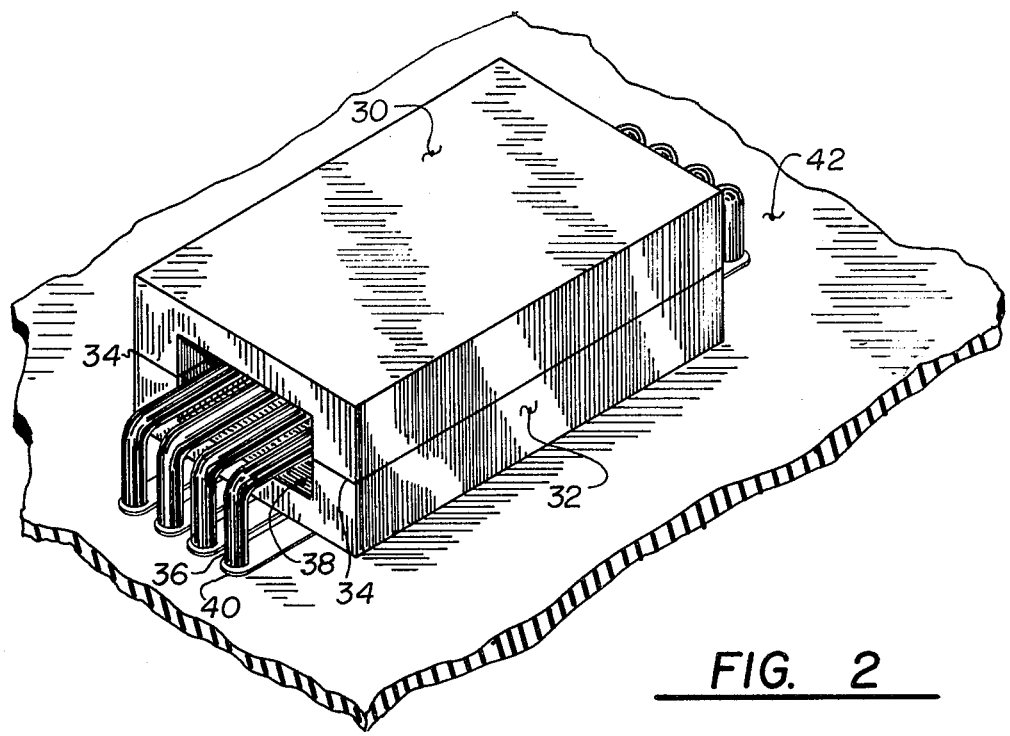
FIG. 2 is a perspective view of the inductor of this invention mounted on an associated printed circuit board.

FIG. 2 is a perspective view of the inductor of this invention mounted on an associated printed circuit board. The inductor includes in combination a pair of channel-shaped core members 30 and 32, assembled with a gap material 34 at the adjacent surfaces. Conductors 36 pass through aperture 38, as formed by the opposed channels, and are electrically interconnected to printed circuit foil paths 40 mounted on printed circuit board 42.

The channel-shaped core members 30 and 32 are characteristically ferrite and are designed from commercially available ferrite stock. The gap material 34 is selected to approximate the permeability of air, and Mylar ® has been found to provide appropriate characteristics for the gap material. The cores are held together by glue applied to the gap material.

The number of conductors 36 will depend upon the number of turns required to provide the current density for the embodiment of inductor selected, and characteristically will range from one to four conductor segments. The ends of the conductors pass through plated through holes in the printed circuit boards 42, and are electrically connected thereto. The conductor segments are connected in series through a selected pattern of printed circuit foils 40 on both the upper and lower surfaces of board 42. The precise pattern selection of interconnection for the various embodiments will be described in more detail below.

Figure 3:
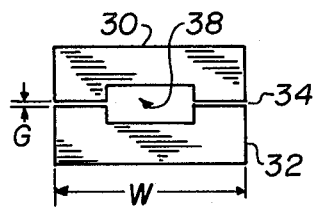
FIG. 3 is the end elevation view of pair of channeled core members.

FIG. 3 is the end elevation view of a pair of channeled core members. This end view illustrates essentially the cross-section of ferrite core members 30 and 32 positioned with gap 34. The thickness G of the gap material 34 is selected to give the required inductance for the application. The width dimension W is one inch for this embodiment. The legs of the channel-shaped ferrite core members 30 and 32 are oppositely disposed forming aperture 38 axially through the length of the core structure.

Figure 4:
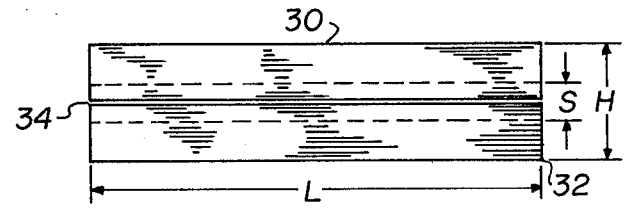
FIG. 4 is a side elevation view of a pair of channeled core members.

FIG. 4 is a side elevation view of the pair of channeled core member. This side view illustrates that ferrite core members 30 and 32 are substantially the same length L, which for this embodiment is two inches. The height H of the core assembly is characteristically 0.5 inch, and the interior height S of aperture 38 is characteristically 3/32 inch. It will of course be understood that the dimensions set forth are illustrative, and that dimensional variations can be made to achieve different manufacturing requirements or operational requirements while remaining within the scope of the invention.

Figure 5:
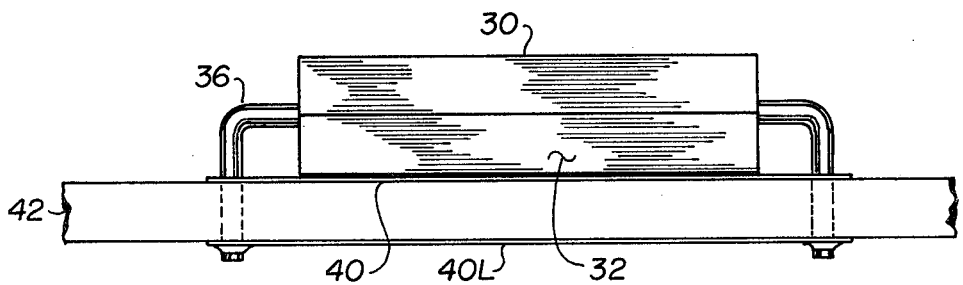
FIG. 5 is a side elevation view of the inductor mounted on a printed circuit board.

FIG. 5 is a side elevation view of the inductor mounted on a printed circuit board. This side view illustrates the relationship of conductor(s) 36 through the core assembly comprised of channel-shaped cores 30 and 32. It illustrates that each of the conductors 36 has downwardly extending portions at each end thereof, the ends being sufficiently long to pass through the plated through holes in printed circuit board 42. While the printed circuit foil interconnection paths 40 could be on either the upper or lower surfaces of printed circuit board 42, in the preferred embodiment identical patterns of printed circuit foil are laid down on the upper surface as indicated by printed circuit foil 40, and on the lower surface of the printed circuit board as indicated by printed circuit foil 40L. These patterns will be described in more detail below.

Figure 6:
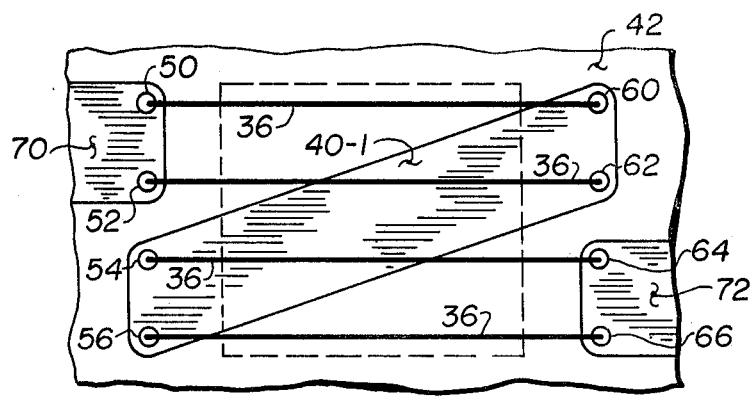
FIG. 6 is a plan view of a printed circuit foil connection path for forming two loops through the inductor core.

FIG. 6 is a plan view of a printed circuit foil connection path for forming two loops through the inductor core. Printed circuit board 42 has a first set of plated through holes 50, 52, 54 and 56, and a second set of plated through holes 60, 62, 64 and 66. This configuration illustrates two turns through the core assembly and is accomplished by plated through holes 50 and 52 being electrically connected in commom by printed circuit foil 70, plated through holes 64 and 66 coupled in common by printed circuit foil 72, and plated through holes 60 and 62 coupled in common and in series by printed circuit foil 40-1 to plated through holes 54 and 56. In this configuration, it can be seen that conductors 36 spanning holes 50 and 60, and spanning holes 52 and 62, will be electrically connected in parallel. Similarly, conductors 36 spanning holes 54 and 64, the spanning holes 56 and 66 will be coupled in parallel. The current path, then, can be considered to be into the inductor on printed circuit foils 70, up through the paralleled conductors 36 at holes 50 and 52, through the paralleled conductors and down through holes 60 and 62, returned on printed circuit foil 40-1 up through holes 54 and 56, through the conductors associated therewith and down through holes 64 and 66, and out on printed circuit foil 72.

Figure 7:
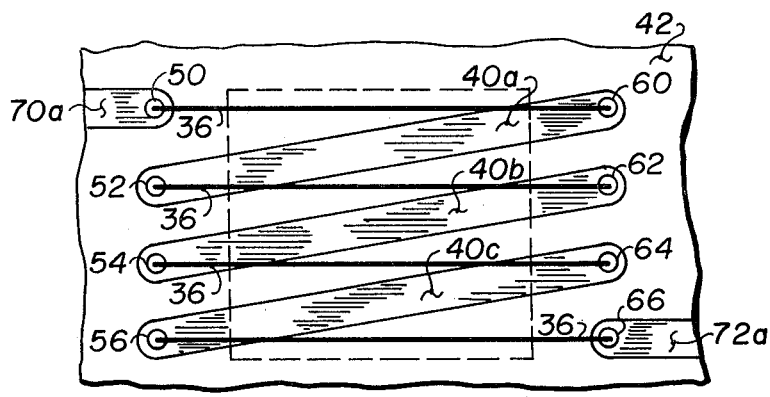
FIG. 7 is a diagrammatic plan view of the printed circit foil for forming four loops through the inductor core.

FIG. 7 is a plan view of a printed circuit foil connection path for forming four loops through the inductor core. This configuration utilizes printed circuit foils to serially interconnect the conductors 36. Foil 40a connects plated through holes 52 and 60, foil 40a connects plated through holes 54 and 62, and foil 40c connects plated through holes 56 and 64. Foil 70a is electrically connected to plated through hole 50 and foil 72a is electrically connected to plated through hole 66. When the conductors 36 are electrically interconnected with their respectively associated pairs of plated through holes, four conductor loops through the core assembly are formed, within the return conductive paths formed by printed circuit foils 40a, 40b and 40c.

Figure 8:
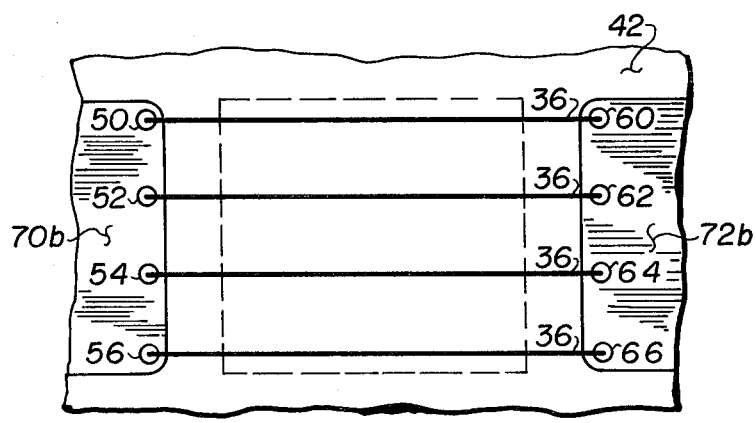
FIG. 8 is a plan view of the printed circuit board format for a single loop through the core.

FIG. 8 is a diagrammatic plan view of the printed circuit foil for forming a single loop through the inductor core. No printed circuit foil return conductive paths are utilized in this settlement. Instead, plated through holes 50, 52, 54 and 56 are coupled electrically in common by printed circuit foil 70b. Similarly, plated through holes 60, 62, 64 and 66 are electrically connected in common by printed circuit foil 72b. When the conductors 36 are electrically connected between their respectively associated pairs of plated through holes, there results a single conductive loop through the core material.

The inductor configurations described above are intended for use in power supplies having different voltage and current capabilities. The inductor constructed as described in FIG. 6 is intended for typical use in a power supply providing 5 volts and 50 amperes. The inductor described in FIG. 7 is intended for use in a power supply typically providing 12 volts and 25 amperes. The inductor described in FIG. 8 is intended for use in a power supply typically providing 2 volts and 100 amperes. By design, the current density is the same for each configuration. The current density is determined by the number of conductors through the core multiplied times the applied current. For a 2 volt power supply, one turn times 100 amperes results in a current density of 100 amperes. For a 5 volt power supply, 50 amperes multiplied by two conductor turns results in a current density of 100 amperes. Finally, for a 12 volt power supply, 25 amperes applied to four cocductor turns results in a current density of 100 amperes. It can be seen, then, that one identical core structure and gap arrangement can be utilized for each power supply configuration.

From the arrangements and embodiments described, the resultant inductance, which is proportional to the square of the conductor turns through the core, is appropriate for each version of the power supply. Since the core and gap assembly can be the same for all embodiments, and since the interconnecting conductors are the same for all embodiments, with the only difference residing in the pattern of plated through hole interconnect, it is clear that the stated objectives of low cost, universality, low physical profile, and ease of manufacture have been satisfied. The processes for providing printed circuit foil paths and plated through holes are well known and need not be described in detail.

Having described embodiments that satisfy the various stated purposes and objectives of the invention, and without departing from the spirit and scope of the invention, what is intended to be protected by Letters Patent is set forth in the appended claims.

What is claimed is:

1. An improved low self-capacitance high frequency inductor in combination comprising:

a plurality of substantially linear electrically conductive segment means for conducting a unidirectional current with a high frequency component superimposed thereon;

a pair of channel-shaped ferrite core means for use as the core of the inductor, each of said pair having first and second legs, spaced apart and extending longitudinally therefrom, said first legs of said pair and said second legs of said pair having superposed contact surfaces proximately separated by gap means having a predetermined permeability and defining an axial aperture for linearly receiving said electrically conductive segment means; and printed circuit board means having a predetermined array of mounting holes therein, ones of said mounting holes plated through with electrically conductive means, and said plated through electrically conductive means in predetermined ones of said holes electrically coupled together by printed circuit conductive means, for defining one of a plurality of available conductor turns patterns, wherein adjacent ends of predetermined ones of said conductive segment means are electrically connected in parallel by ones of said printed circuit conductive means on said printed circuit board means, and opposing ends of the parallel grouping thus formed are electrically connected in series by other ones of said printed circuit conductors mounted on said printed circuit board means; each of said segment means including connection means for engaging associated ones of said plated through holes in said printed circuit board means and making electrical interconnection therewith.

2. An improved inductor as in claim 1 wherein said predetermined permeability approximates the permeability of air.

3. An improved inductor as in claim 2 wherein
said conductive segment means are grouped into two groups of contiguous ones of said conductive segment means and said conductive segment means in each of said groups are coupled in parallel by first associated ones of said printed circuit conductive means; and
second ones of said printed circuit conductive means are for coupling said two groups of conductive segment means in series to form conductive winding of two turns through said axial aperture.

4. An improved inductor as in claim 1 wherein ones of said printed circuit conductive means couple said conductive segment means in series to form inductor windings to said aperture equal to the number of said conductive segments means.

5. An improved inductor as in claim 4 wherein said number of conductive segment means is four.

6. An improved inductor as in claim 1 wherein ones of said printed circuit conductive means couple all of said segment means in parallel to form an inductor winding having a single turn through said aperture.

7. An improved inductor as in claim 1 wherein each of said plurality of available conductor turn patterns provide like current densities.

* * * * *